United States Patent
Liang et al.

(10) Patent No.: US 10,041,167 B2
(45) Date of Patent: Aug. 7, 2018

(54) CYCLIC SEQUENTIAL PROCESSES FOR FORMING HIGH QUALITY THIN FILMS

(71) Applicant: Applied Materials, Inc., Santa Clara, CA (US)

(72) Inventors: Jingmei Liang, San Jose, CA (US); Jung Chan Lee, Sunnyvale, CA (US); Jinrui Guo, Santa Clara, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/001,384

(22) Filed: Jan. 20, 2016

(65) Prior Publication Data

US 2016/0244879 A1 Aug. 25, 2016

Related U.S. Application Data

(60) Provisional application No. 62/119,714, filed on Feb. 23, 2015.

(51) Int. Cl.
*B05D 3/06* (2006.01)
*C23C 16/04* (2006.01)
(Continued)

(52) U.S. Cl.
CPC .......... *C23C 16/045* (2013.01); *C23C 16/308* (2013.01); *C23C 16/345* (2013.01);
(Continued)

(58) Field of Classification Search
CPC ... C23C 16/045; C23C 16/047; C23C 16/345; C23C 16/36; C23C 16/401;
(Continued)

(56) References Cited

U.S. PATENT DOCUMENTS 7,790,633 B1  9/2010  Tarafdar et al.
7,888,273 B1* 2/2011  Wang ................ H01L 21/76224
                                              438/778
(Continued)

FOREIGN PATENT DOCUMENTS

KR          10-1201402          11/2012

OTHER PUBLICATIONS

PCT Notification of Transmittal of the International Search Report and the Written Opinion of the International Searching Authority for International Application No. PCT/US2016/014004; dated Apr. 29, 2016; 10 total pages.

*Primary Examiner* — Marianne L Padgett
(74) *Attorney, Agent, or Firm* — Patterson + Sheridan LLP

(57) ABSTRACT

Methods are described for a cyclical deposition and curing process. More particularly, the implementations described herein provide a cyclic sequential deposition and curing process for filling features formed on a substrate. Features are filled to ensure electrical isolation of features in integrated circuits formed on a substrate. The processes described herein use flowable film deposition processes that have been effective in reducing voids or seams produced in features formed on a substrate. However, conventional gap-filling methods using flowable films typically contain dielectric materials that have undesirable physical and electrical properties. In particular, film density is not uniform, film dielectric constant varies across the film thickness, film stability is not ideal, film refractive index is inconsistent, and resistance to dilute hydrofluoric acid (DHF) is not ideal in conventional flowable films. The cyclic sequential deposition and curing processes address the issues described herein to create films with higher quality and increased lifetime.

12 Claims, 7 Drawing Sheets

(51) Int. Cl.
*C23C 16/30* (2006.01)
*C23C 16/40* (2006.01)
*C23C 16/48* (2006.01)
*C23C 16/34* (2006.01)
*C23C 16/36* (2006.01)
*C23C 16/505* (2006.01)

(52) U.S. Cl.
CPC ............ *C23C 16/36* (2013.01); *C23C 16/402* (2013.01); *C23C 16/483* (2013.01); *C23C 16/505* (2013.01)

(58) Field of Classification Search
CPC . C23C 16/402; C23C 16/42; C23C 16/45536; C23C 16/4554; C23C 16/482; C23C 16/483; C23C 16/50–16/509; C23C 16/5096; C23C 16/511; C23C 16/515
USPC ........ 427/489, 534–537, 539, 553–556, 558, 427/563, 578, 579; 438/761, 764, 438/770–778, 787–794
See application file for complete search history.

(56) References Cited

U.S. PATENT DOCUMENTS

| | | | |
|---|---|---|---|
| 8,557,712 B1 | 10/2013 | Antonelli et al. | |
| 8,754,407 B2 | 6/2014 | Takemura et al. | |
| 8,993,072 B2 | 3/2015 | Xiao et al. | |
| 9,029,272 B1* | 5/2015 | Nakano | H01L 21/02126 438/424 |
| 9,404,178 B2* | 8/2016 | Liang | C23C 16/401 |
| 9,570,287 B2* | 2/2017 | Liang | C23C 16/345 |
| 2004/0138489 A1 | 7/2004 | Wang et al. | |
| 2004/0203255 A1 | 10/2004 | Itsuki | |
| 2007/0281448 A1* | 12/2007 | Chen | C23C 16/045 438/478 |
| 2007/0281495 A1* | 12/2007 | Mallick | C23C 16/045 438/778 |
| 2009/0075490 A1 | 3/2009 | Dussarrat | |
| 2011/0151678 A1* | 6/2011 | Ashtiani | H01L 21/76224 438/786 |
| 2012/0111831 A1* | 5/2012 | Ha | C23C 16/325 216/37 |
| 2012/0149213 A1* | 6/2012 | Nittala | C23C 16/02 438/783 |
| 2012/0238108 A1* | 9/2012 | Chen | C23C 16/345 438/765 |
| 2013/0149462 A1* | 6/2013 | Liang | C23C 16/401 427/539 |
| 2014/0017904 A1 | 1/2014 | Gauri et al. | |
| 2014/0106574 A1* | 4/2014 | Kang | H01L 21/022 438/778 |
| 2015/0044882 A1 | 2/2015 | Draeger et al. | |
| 2015/0118863 A1* | 4/2015 | Rathod | H01L 21/02164 438/778 |
| 2015/0140833 A1* | 5/2015 | Thadani | H01L 21/02219 438/762 |

* cited by examiner

CYCLIC SEQUENTIAL PROCESSES FOR FORMING HIGH QUALITY THIN FILMS

CROSS-REFERENCE TO RELATED APPLICATIONS

This application claims priority to U.S. Provisional Patent Application Ser. No. 62/119,714, filed Feb. 23, 2015, which is incorporated by reference herein.

BACKGROUND

Field

Implementations of the present disclosure generally relate to an apparatus and methods for forming a film on a semiconductor substrate.

Description of the Related Art

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing device sizes result in structural features having decreased width within the formed device. As features narrow in width, filling features with dielectric material becomes more challenging. Dielectric material deposition processes are prone to generating seams or voids in a feature formed on a substrate without completely filling the feature. Advanced gap fill applications employ flowable chemical vapor deposition processes to form a planarized dielectric film while preventing the formation of voids or seams in the feature.

The typical process for gap fill applications involves a bulk film deposition step at low temperatures, a thermal or non-thermal curing process for film composition conversion after the bulk film deposition, and a final densification process at elevated temperatures. During the bulk film treatment and densification processes, the act of curing can cause the film to form regions that have different material properties, which often leads to variations in film quality.

In particular, when features are bulk filled, curing results in cross-linking and densification first near the surface of the deposited layer formed over the feature. This surface phenomenon, which is often called "crusting," prevents the ultraviolet light from penetrating deeper into the features, and thus prevents complete cross-linking and densification throughout the deposited material layer. The variation in the "curing" in different regions of the deposited layer creates a gradient in the optical, physical and electrical properties of the deposited layer, such as a gradient in the dielectric constant across the thickness of the deposited layer, which can affect the device's electrical performance and device yield.

Also, deployment of new smaller electrical devices reduces the thermal budget for deposition of dielectric materials at advanced nodes. Traditional bulk film deposition requires a final densification process at temperatures that may range from 300 degrees Celsius to 1100 degrees Celsius. Such high temperatures may damage advanced materials such as selenium germanium ($Si_xGe_y$) and Group III-V compounds used in these advanced nodes.

Therefore, there is a need for improved methods for depositing and forming dielectric layers used in advanced nodes.

SUMMARY

Implementations described herein generally relate to the deposition and treatment of thin films for gap filling. More particularly, the implementations described herein relate to the cyclic sequential deposition and curing of thin films. In one implementation, a method of cyclic sequential deposition and curing of a thin film is provided. The method comprises depositing a thin layer of film at a low temperature, curing the deposited film under ultraviolet light, and repeating the sequence multiple times before exposing the substrate to a final densification process.

In one implementation, a method for processing a substrate can include forming a first flowable film having a thickness in a feature of a substrate, wherein the thickness is less than the height of the feature, forming the first flowable film including depositing a first flowable film in the feature; exposing the substrate to an oxygen containing plasma; exposing the substrate to ultraviolet light; and repeating the process of forming the first flowable film to form one or more layers of second flowable film over the first flowable film, wherein the first flowable film and the one or more layers of second flowable film together have a film thickness equal to or greater than the height of the feature.

In another implementation, a method for filling a feature in a substrate can include forming a flowable dielectric film having a thickness in the at least one feature, wherein the thickness is less than the height of the feature, wherein the forming of the flowable dielectric film including providing a silicon precursor to a processing region in a processing chamber in which a substrate is disposed; forming a plasma; and introducing at least a portion of the gas that was exposed to the plasma into the substrate processing region; exposing the substrate to an oxygen containing plasma; exposing the substrate to ultraviolet light; and repeating the preceding steps to form additional layers of flowable film over the flowable film, wherein the several layers together form a flowable film stack having a film thickness equal to or greater than the height of the at least one feature.

In another implementation, a method of forming a layer, the method including flowing a non-oxygen containing precursor over a patterned substrate disposed into a first substrate processing chamber; depositing a film having a thickness over the patterned substrate, wherein the thickness is less than the depth of a feature on the substrate; exposing the patterned substrate to a plasma; transferring the patterned substrate into a second substrate processing chamber equipped with an ultraviolet light source; exposing the patterned substrate to ultraviolet light provided by the ultraviolet light source; and repeating the preceding steps to form additional layers of flowable film over the flowable film, wherein the several layers together form a flowable film stack having a uniform density and a film thickness equal to or greater than the height of the at least one feature.

In another implementation, a processing system can include a first chamber, comprising a silicon containing precursor source in connection with the first chamber; and a plasma source; a second chamber, comprising a source of ultraviolet light source; and a memory having computer-executable instructions for performing the method comprising forming a flowable film having a thickness in the at least one feature, wherein the thickness is less than the height of the feature, and the process of forming the flowable film comprises depositing a flowable film in the feature; exposing the substrate to an oxygen containing plasma; exposing the substrate to ultraviolet light from the ultraviolet light source; and repeating the process of forming the flowable film to form additional layers of flowable film over the formed flowable film, wherein the formed flowable film and the one or more additional layers each has a similar thickness; and the formed flowable film and the one or more additional layers together have a film thickness equal to or greater than the height of the at least one feature.

BRIEF DESCRIPTION OF THE DRAWINGS

So that the manner in which the above recited features of the present devices and methods can be understood in detail, a more particular description of the devices and methods, briefly summarized above, may be had by reference to implementations, some of which are illustrated in the appended drawings. It is to be noted, however, that the appended drawings illustrate only typical implementations of this devices and methods and are therefore not to be considered limiting of its scope, for the devices and methods may admit to other equally effective implementations.

Figure 1:
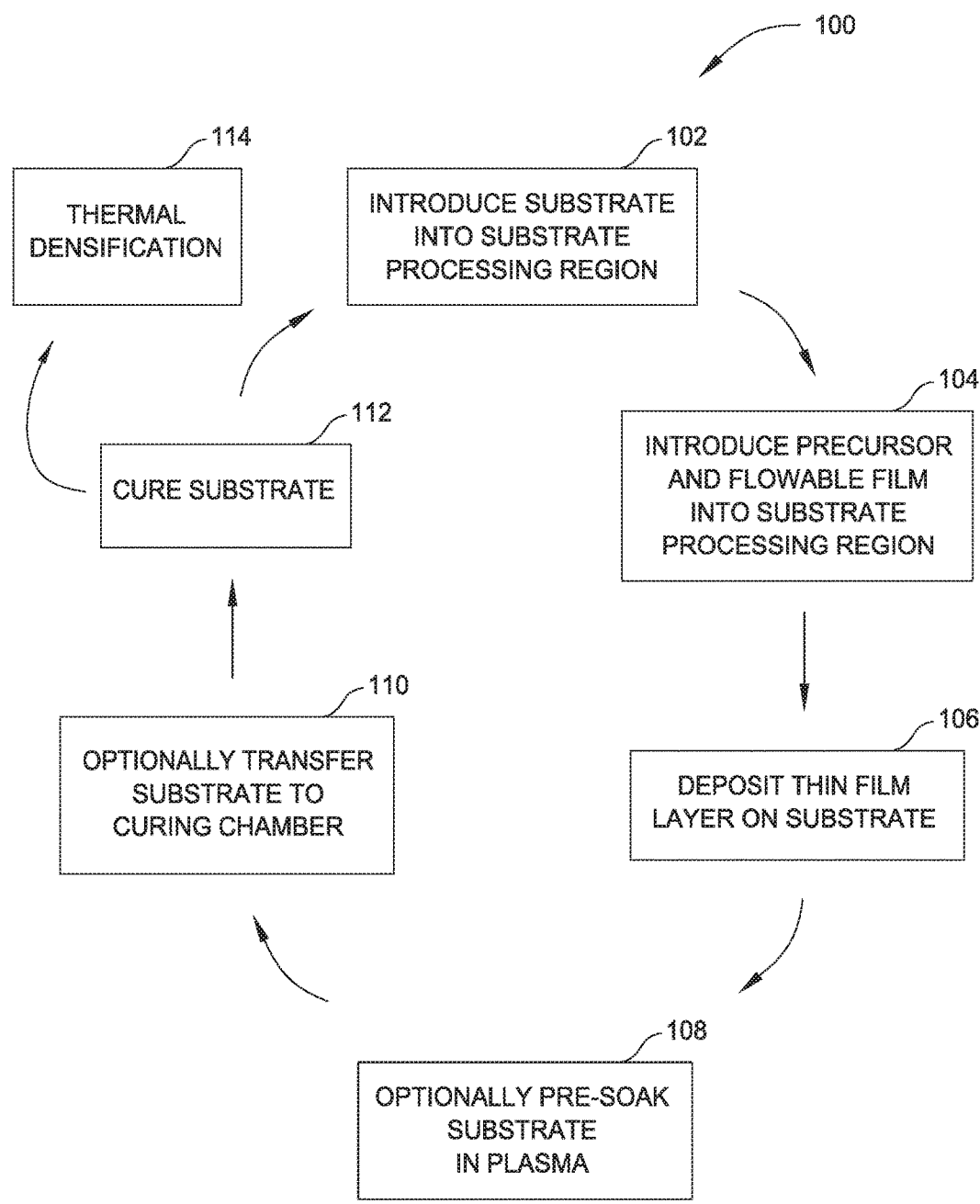
FIG. 1 is a flowchart depicting one implementation of a cyclic sequential deposition and curing method according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein generally provide a cyclical deposition and curing process to form a layer within an integrated circuit device that has improved optical, physical and electrical properties. More particularly, the implementations described herein provide a cyclic sequential deposition and curing process for filling features formed on a substrate. Features are filled to ensure electrical isolation of features in integrated circuits formed on a substrate. The processes described herein may use flowable film deposition processes that have been effective in reducing voids or seams produced in features formed on a substrate. However, conventional gap-filling methods using flowable films typically produce dielectric materials that have undesirable physical and electrical properties. In particular, film density is not uniform, film dielectric constant varies across the film thickness, film stability is not ideal, film refractive index is inconsistent, and resistance to dilute hydrofluoric acid (DHF) during cleaning processes is not ideal in conventional flowable films. The cyclic sequential deposition and curing processes described herein address these issues to create higher quality films that have improved material properties, improved device yield and increased useable lifetime.

In some implementations, a thin flowable film layer is deposited over a substrate, having features formed therein, using a cyclic sequential process to prevent variation in the physical properties and electrical properties through the deposited layer. After depositing the thin layer of flowable film, the substrate is optionally pre-soaked in a plasma, radical containing gas, gas or combination thereof to prepare the substrate for a curing process. The substrate is then exposed to a curing process, which may be performed using a source of ultraviolet light, which results in cross-linking in the thin layer. The process is then repeated cyclically until the features are filled. The sequential layering of film to fill the features formed on the substrate results in enhanced uniformity of cross-linking, density and dielectric constant value within the features formed on the substrate, enhancing the performance and functionality of the semiconductor devices formed on the substrate.

FIG. 1 is a flowchart illustrating a method of forming a dielectric layer using a cyclic sequential deposition and curing process. At block 102, a substrate containing features is positioned within a substrate processing region of a process chamber. The substrate may be a silicon substrate, a silicon-germanium containing substrate, or a III-V compound containing substrate or other useful semiconductor substrate material. The features formed on the substrate may include trenches, vias, gaps, spacers, other isolation features. In a usual feature-filling application, a film is flowed across the surface of the substrate to fill the features with dielectric material. Because of the decreasing spatial dimensions of features on a substrate as semiconductor geometries decrease in size, the width of features shrinks even as the depth of features remains the same or increases. The increasing depth-to-width ratio of features creates challenges in filling the features with conventional dielectric materials, because the dielectric material is prone to pinching-off or clogging at the top before filling the feature completely. This creates voids or seams in the features below the surface of the dielectric material, which compromises the integrity of the semiconductor product. The methods disclosed herein address this need.

At block 104, one or more precursors are introduced into the substrate processing region of the deposition chamber to deposit a dielectric layer over the features formed on the substrate. In some implementations, the one or more precursors are dielectric material forming precursors, such as a silicon containing precursor. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetra-methylcyclotetrasiloxane (TMCTS), tetramethyl-diethoxy-disiloxane (TMDDSO), dimethyl-dimethoxy-silane (DMDMS), or combinations thereof. Additional precursors for the deposition of silicon nitride include $Si_xN_yH_zCl_{zz}$-containing precursors, such as silyl-amine and its derivatives including trisilylamine (TSA) and disilylamine (DSA), $Si_xN_yH_zO_{zz}$-containing precursors, $Si_xN_yH_zCl_{zz}$-containing precursors, or combinations thereof. The dielectric material precursor may be supplied into the processing chamber at a flow rate between about 1 sccm and about 5000 sccm. The processing precursors may be supplied into the processing chamber at a flow rate between about 1 sccm and about 1000 sccm.

The one or more precursors may also include processing precursors that may include hydrogen-containing compounds, oxygen-containing compounds, nitrogen-containing compounds, or combinations thereof. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma excited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein. In some configurations, the one or more precursors delivered to the process chamber include a gas mixture that includes a dielectric material precursor to processing precursor ratio of between about 0.1 and about 100. One or more inert gases may also be included with the gas mixture provided to the process chamber. The inert gas may include, but is not limited to, noble gas, such as Ar, He, Xe, and the like. The inert gas may be supplied to the processing chamber at a flow ratio of between about 1 sccm and about 50000 sccm. During processing the process pressure in the processing region of the chamber may be maintained at between about 0.10 Torr to about 10 Torr, for example, about 0.1 Torr and about 1 Torr, such as about 0.5 Torr and about 0.7 Torr.

In one implementation, the substrate temperature during the deposition process is maintained at a predetermined range. In one implementation, the substrate temperature is maintained at less than about 200 degrees Celsius, such as less than 100 degrees Celsius so as to allow the dielectric material formed on the substrate to be flowable to form within the features formed on the substrate. In one implementation, the substrate temperature in the process chamber is maintained at a range between about room temperature to about 200 degrees Celsius, such as about less than 100 degrees Celsius, for example about 30 degrees Celsius and about 80 degrees Celsius.

In some implementations, an RF power is applied to maintain a plasma during deposition. The RF power is provided between about 100 kHz and about 100 MHz, such as about 350 kHz or about 13.56 MHz. Alternatively, a VHF power may be utilized to provide a frequency up to between about 27 MHz and about 200 MHz. In one implementation, the RF power may be supplied between about 1000 Watt and about 10000 Watt.

In one example of a process performed at block 104, a silicon-containing precursor may be provided to a processing chamber and an RF plasma is formed while the substrate is maintained in the processing chamber. The precursor gas may be a carbon-containing precursor.

At block 106, a thin film layer of minimum thickness is deposited on the substrate. The minimum thickness is sufficient to allow the film to flow and is thin enough that the layer fills only a first portion of the feature. The precursor flow is then stopped and the residual gases are removed from the substrate processing region of the process chamber. Suitable films for this application may include silicon oxides ($SiO_x$), silicon nitrides ($SiN_x$), silicon carbides ($SiC_x$), silicon carbon nitrides ($Si_xC_yN_z$), or polysilicon (Si), among others. Because flowable films are viscous, they must be of a certain thickness to ensure complete coverage of the surface of the substrate. Each layer of film deposited must have a minimum thickness to ensure the flowability of the film. In one implementation, the thickness of a layer is between 50 Angstroms and 150 Angstroms. A person skilled in the art will understand that the thickness of a layer will depend on several factors, including the size of the features and the nature of the film being deposited.

At block 108, a plasma is optionally introduced into the substrate processing region. In some cases, the plasma may be an oxygen containing plasma. Oxide films are transparent to ultraviolet rays, so that after the oxide film is deposited into the top of an underlying film layer, the ultraviolet rays may still penetrate the deposited film layer and reach the underlying film layer.

At block 110, the substrate is transferred from the substrate processing region to a curing chamber. During the transfer step the inert environment is maintained and the substrate is not exposed to undesirable contaminants. It is believed that the preservation of vacuum conditions is useful to prevent the undesirable oxidation of the thin film layer at this stage of each cycle. Oxidation may negatively affect adhesion properties or electrical properties of the resulting dielectric film.

At block 112, the substrate is exposed to low temperature ultraviolet light from a light source in the curing chamber. The ultraviolet light may be delivered from a 200-450 watt lamp and may have a wavelength between 100 nm and 250 nm. The exposure may have a duration of one minute. However, a person skilled in the art will understand that the wattage and wavelength of the UV light and the duration of the exposure to the light will depend upon the nature and thickness of the film deposited.

Returning to block 102, the substrate may be returned to the substrate processing region of the deposition type process chamber. During the transfer step the inert environment is maintained at a level so that the substrate is not exposed to contaminants. Again, the preservation of vacuum conditions is useful to prevent the undesirable oxidation of the thin film layer at this stage of each cycle. This restarts the full cycle of deposition of an additional layer, pretreatment with plasma, and curing with UV, after which the cycle begins again. The cycle is repeated until the desired number of layers has been deposited and cured. In one implementation, the cycle is repeated twenty times so that twenty layers are deposited on the substrate. A person skilled in the art will understand that the number of cycles will vary depending on the depth of the features, the thickness of the film layers, and other factors.

After the cycle has been repeated for a desirable number of times, the layered deposited film is treated for thermal densification at block 114. In the case of an oxide film, the thermal densification is performed by use of a furnace anneal process.

Figure 2:
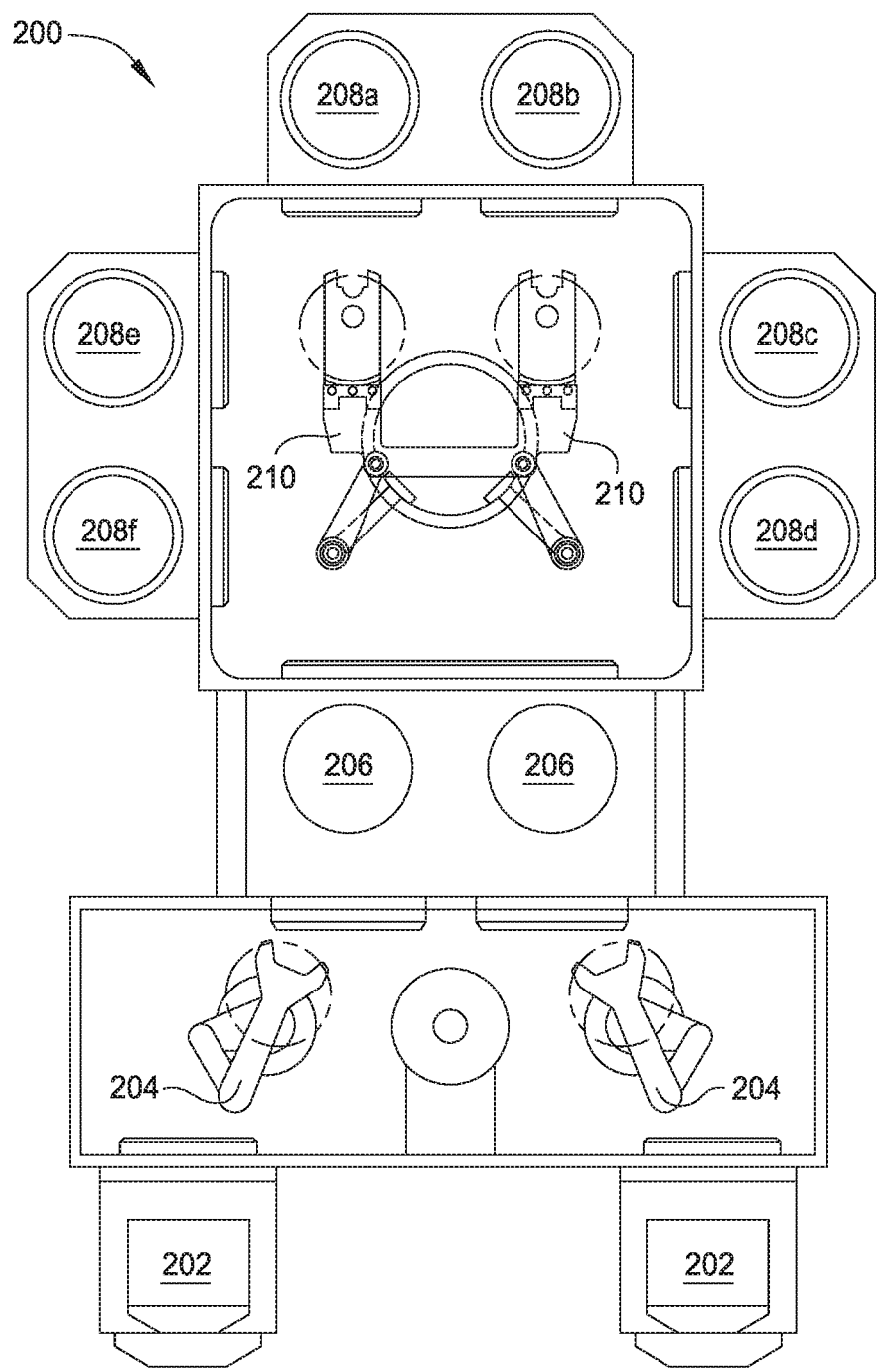
FIG. 2 is a top schematic plan view of one implementation of a substrate processing system, according to an implementation described herein.

FIG. 2 shows a substrate processing system 200 for depositing and curing film layers according to one implementation. As shown in FIG. 2, a pair of front opening unified pods 202 supplies substrates that are received by robotic arms 204 and placed into a low pressure holding area 206 before being placed into one of the substrate processing chambers 208a-208f. A second robotic arm 210 may be used to transport the substrates from the holding area 206 to and from the substrate processing chambers 208a-208f.

Substrate processing chambers 208a-208f may include one or more system components for depositing, annealing, curing, and/or etching a flowable film such as SiO, SiN, SiC, SiCN, polysilicon, or other film in features formed on a substrate. In one configuration, two pairs of the processing chamber (e.g., 208c-208d and 208e-208f) may be used to deposit the flowable film in the features and pre-soak the film, and the third pair of processing chambers (e.g., 208a-208b) may be used to treat the deposited film, such as performing UV treatment. Use of this substrate processing system allows execution of the entire method within a constant vacuum environment. Use of the integrated vacuum system to carry out the deposition and cure process avoids undesirable oxidation of the thin film layer while the cyclical process is ongoing.

Figure 3A:
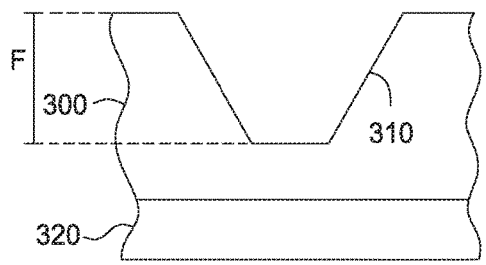
FIGS. 3A-3E are a series of cross sectional schematic views of a trench being filled pursuant to one implementation of a cyclic sequential deposition and curing method according to implementations described herein.

FIGS. 3A-3E are a series of cross sectional schematic views of a feature being filled pursuant to one implementation of a cyclic sequential deposition and curing method according to implementations described herein. FIG. 3A shows a cross sectional schematic view of a feature 310 prior to the initiation of the cyclic sequential deposition and curing process. Substrate 300 may be a silicon substrate, a silicon-germanium containing substrate, a III-V compound containing substrate, or another appropriate substrate. Substrate 300 has at least one feature 310, such as a trench, via, gap, or other isolation feature. Substrate 300 is disposed on a substrate support 320 during the deposition processing sequence.

Figure 3D:
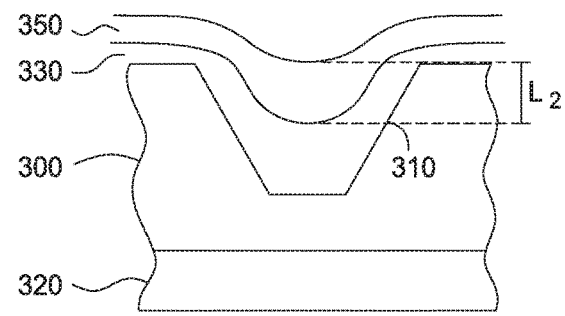
Figure 3B:
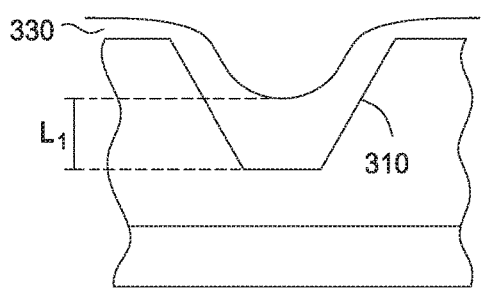

In FIG. 3B, a first material layer 330 is disposed on the substrate 300. The first material layer 330 may be a silicon-containing layer, such as $SiO_x$, $SiN_x$, $SiC_x$, $Si_xC_yN_z$, polysilicon, or other film. The material layer may be disposed by flowing a precursor, vapor and/or gas into the substrate processing region in which the substrate support 320 and substrate 300 have been disposed. The precursor, vapor or gas may be a carbon-free silicon precursor, such as a silicon and nitrogen precursor, or a silicon and hydrogen precursor, or a silicon, nitrogen and hydrogen containing precursor, or another precursor, including a carbon-containing precursor, as discussed above.

The temperature of the substrate during deposition of the first material layer may be less than 100° C. A person of ordinarily skill in the art will understand that the temperature of the substrate during deposition of the film may vary depending upon the silicon precursor and the plasma vapor or gas used.

The first material layer 330 has a thickness $L_1$. The feature itself has a depth of F. The thickness $L_1$ is at least a minimum thickness that is sufficient to allow the film to flow and is thin enough that the layer fills only a first portion of the one or more features 310 on the substrate. In other words, thickness $L_1$ is less than depth F. Providing a material layer thickness $L_1$ that is less than feature depth F will allow better light penetration in the layer during the UV curing step and therefore lead to more uniform film properties. For example, a material layer may have a thickness between 50 Å and 150 Å, for example, 100 Å. It is believed that thinner layers will provide higher quality films because thinner layers tend to promote uniformity of optical and electrical properties of the dielectric film, as discussed herein. However, thicker layers will increase throughput but risk the problems of bulk fill deposition processes discussed above. After the first material layer 330 having the minimum thickness has been deposited on the substrate and into the one or more features 310, the flow of the precursor and gas is stopped and the remaining precursor and gas are pumped out of the substrate processing region.

The first material layer 330 is then pre-treated with an oxygen containing plasma to prepare the first material layer 330 for curing. The oxygen containing plasma may include one or more of the following: atomic oxygen (O), molecular oxygen ($O_2$), ozone ($O_3$), hydrogen oxides (e.g., $H_2O$, $H_2O_2$), and nitrogen oxides (e.g., NO, $NO_2$, $N_2O$), or other oxygen-containing plasma species. The oxygen containing plasma may also include ions of oxygen containing species or radical oxygen and hydroxyl species such as atomic oxygen (O), hydroxides (OH), and other species.

Figure 3E:
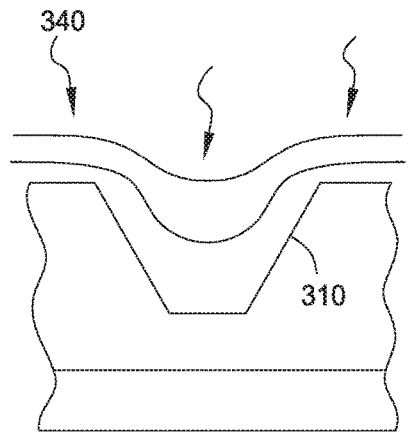
Figure 3C:
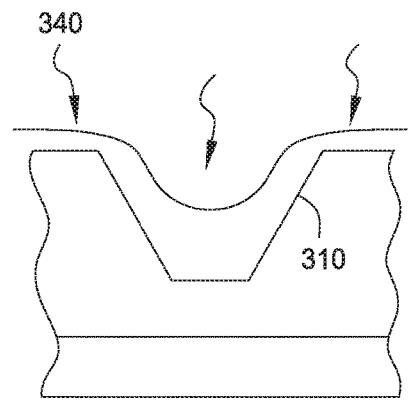

In FIG. 3C, the substrate 300 and the first material layer 330 are exposed to a low temperature ultraviolet light 340. The exposure to ultraviolet light may occur in a curing chamber that is separate from the substrate processing region. During the exposure to ultraviolet light, the substrate may be disposed on a pedestal or substrate support maintained at a temperature of 100° C. or less. The exposure to ultraviolet light 340 results in cross-linking in the first material layer 330. Following the exposure to ultraviolet light 340, if the substrate was earlier moved from the substrate processing region to the curing region, the substrate is then returned to the substrate processing region.

In FIG. 3D, a second material layer 350 having a thickness $L_2$ is deposited on top of the previously deposited and cured first material layer 330. In some implementations, the second material layer 350 may be deposited using the same precursor and gas used to deposit the first material layer 330. The thickness $L_2$ of the second material layer 350 may be equal to or less than or greater than the thickness $L_1$ of the first material layer 330. For reasons discussed below, it may be preferable for second material layer thickness $L_2$ to be greater than first material layer thickness $L_1$. After deposition of the second material layer 350, the second material layer 350 is pre-treated with an oxygen containing plasma according to the process described above to prepare the second material layer 350 for curing.

In FIG. 3E, the substrate 300 and the second material layer 350 and the first material layer 330 are again exposed to a low temperature ultraviolet light 340 according to the process described above. The exposure to ultraviolet light may again occur in a curing chamber that is separate from the substrate processing region. The exposure to ultraviolet light 340 results in cross-linking in the second material layer 350. The exposure to ultraviolet light may also result in further cross-linking in the first material layer 330 which is disposed under the second material layer 350. Because continued cross-linking may occur in earlier deposited layers, a gradient may result in which material properties, such as cross-linking, vary across the depth of the deposited film. To adjust for this continued cross-linking of underlying layers upon exposure to ultraviolet light, each successive deposited material layer may have a thickness greater than the material layer deposited below it. However, each deposited material layer should have a minimum thickness required to allow the flowable film to flow properly in order to improve the uniformity of the material properties of the deposited layered film stack. Furthermore, each successively deposited material layer may shield the layers deposited below it from being exposed to the UV curing process multiple times. To improve this shielding effect, each successively deposited material layer may have a thickness greater than the thickness of a layer deposited below it in order to prevent excessive curing of earlier-deposited layers.

Following the exposure to ultraviolet light 340, if the substrate was earlier moved from the substrate processing region to the curing region, the substrate is then returned to the substrate processing region, where additional material layers may be deposited, pre-treated, and then returned to a curing chamber for curing. Although FIGS. 3A-3E show only two deposited material layers 330 and 350, the process may be repeated many times, depositing many material layers at least until the features are fully filled. The result of the process is a multi-layered deposited film of improved physical, electrical and material property uniformity, and thus being a higher quality film.

Figure 4:
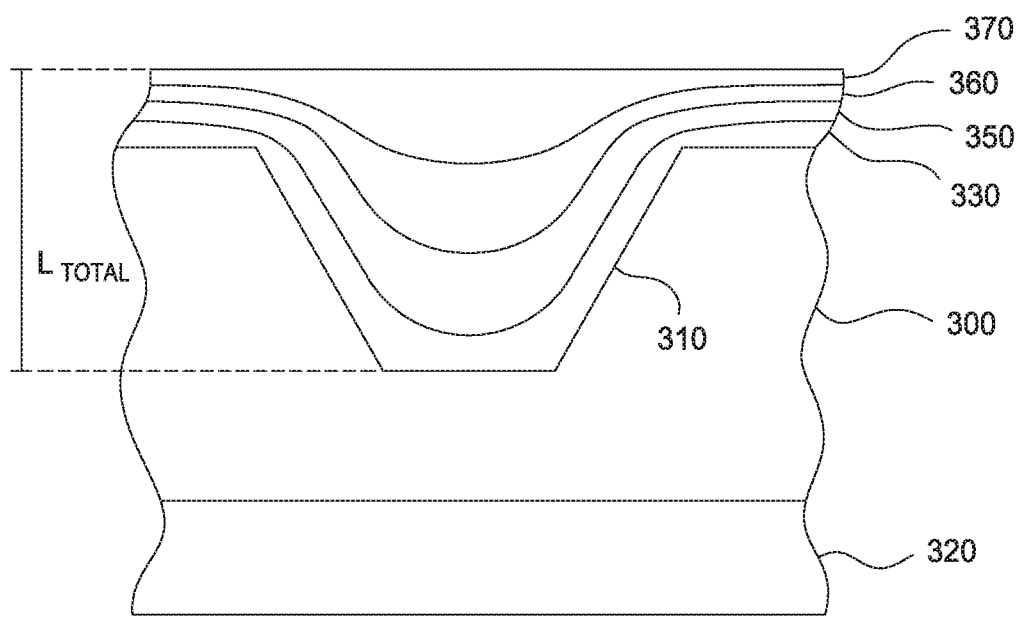
FIG. 4 is a cross sectional schematic view of a feature filled pursuant to one implementation of a cyclic sequential deposition and curing method according to implementations described herein.

FIG. 4 is a cross sectional schematic view of a feature filled pursuant to one implementation of a cyclic sequential deposition and curing method according to implementations described herein. FIG. 4 is a schematic view of a thin film that may result from the repetition of the steps illustrated in FIG. 1 as necessary at least to completely fill the features formed on the substrate. Substrate 300 and its one or more features 310 have been exposed to the steps of the cyclic sequential deposition and curing method 100 through sufficient cycles that at least the features 310 have been completely filled. Therefore, although only four material layers 330, 350, 360, 370 are shown in FIG. 4, a person of ordinary skill in the art will understand that many more layers may also be deposited. Further, although the material layers 330, 350, 360, 370 may appear to have similar thickness, the material layers 330, 350, 360, 370 may alternatively have varying thicknesses, so long as each material layer has at least a minimum thickness necessary to allow the flowable film to flow. As discussed above, the thicknesses of each material layer may also vary such that each successive material layer may serve to shield the layer or layers below it from excessive ultraviolet curing. To that end, each successive material layer may be thicker than the layer below it, such that material layer 370 is thicker than material layer 360; material layer 360 is thicker than material layer 350; material layer 350 is thicker than material layer 330, etc.

Figure 5B:
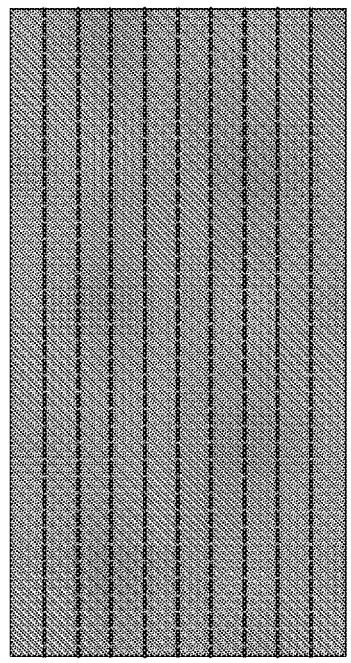
FIGS. 5A and 5B are visual representations of a thin film deposited by a conventional bulk fill deposition and curing process (5A) and a thin film deposited by one implementation of a cyclic sequential deposition and curing process (5B).
Figure 5A:
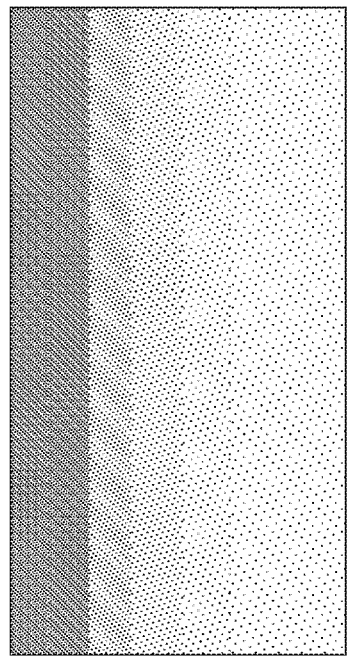
Figure 5A:
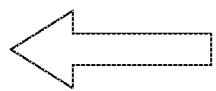

FIGS. 5A and 5B are visual representations of a thin film deposited by one implementation of a conventional bulk fill deposition and curing process (FIG. 5A) and a thin film deposited by one implementation of a cyclic sequential deposition and curing process (FIG. 5B). FIG. 5A illustrates the gradient that is present within the features of a film produced by a bulk fill deposition and cure process. Because the film illustrated in FIG. 5A is deposited in a single step, the ultraviolet rays provided during the curing process do not penetrate deeply into the film and the cross-linking and densification occurs more thoroughly near the surface. The arrow at FIG. 5A indicates this gradient, showing that the degree of cross-linking and densification increases at depths of the film closer to the surface. By contrast, FIG. 5B shows the enhanced uniformity of the material properties of the formed deposited layer stack provided by a cyclic sequential deposition and cure process. Because the film is deposited in thin layers and cyclically cured, the cross-linking is more consistent regardless of depth. FIG. 5B illustrates the enhanced uniformity provided by ten cycles of deposition and cure, but there may be many more or many fewer cycles of deposition and cure, depending on the particular needs of the thin film.

Uniformity of the thin film throughout the depth of the film is a key indicator of film quality. Ideally, density will be both high and uniform throughout the film. In one experiment, the density of a thin film deposited by one implementation of a conventional bulk fill deposition method was compared to the density of a thin film deposited by one implementation of a cyclic sequentially deposited thin film. The density of the film as deposited before cure was measured at 1.3 g/cc. The density of the single-process bulk fill deposited thin film was measured at 1.6 g/cc-1.7 g/cc, and the increased density was measured only within the surface 18 nm of the film. The density of the cyclic sequential deposited thin film increased to 1.9 g/cc-2.1 g/cc, and the improved density was uniform through the film depth. These results demonstrate the improved and uniform density achieved by cyclic sequential deposition and cure method.

Figure 6:
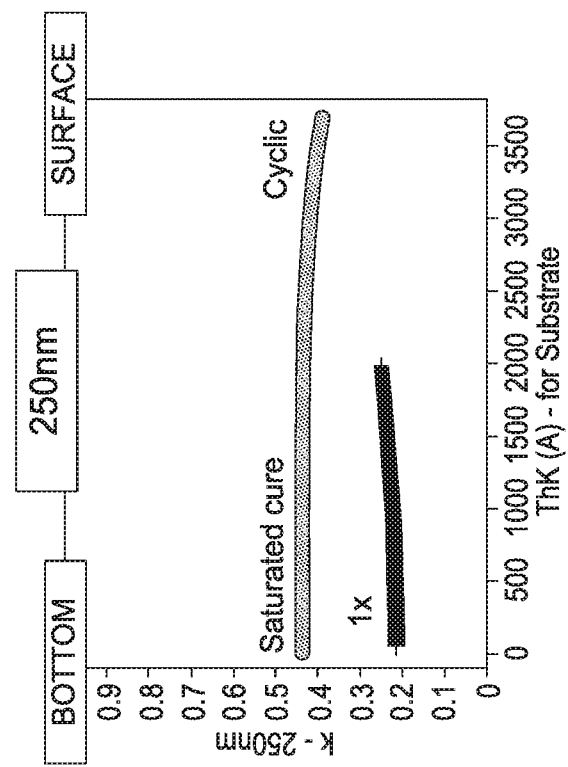
FIG. 6 is a graph comparing the refractive index across a conventional bulk fill deposited and cured film as a function of depth with the refractive index of a film deposited by one implementation of a cyclic sequential deposition and curing methods described herein as a function of depth.

FIG. 6 is a graph comparing the refractive index across a conventional bulk fill deposited and cured film as a function of depth with the refractive index of a film deposited by one implementation of a cyclic sequential deposition and curing methods described herein as a function of depth. Refractive index is an indicator of the density of the deposited film, such that a higher refractive index indicates a more dense film. Densification is important for film quality particularly for films that will be furnace annealed, such as oxide films. When a film is furnace annealed, the density of the film increases, which results in shrinkage of the film layer. A film with greater densification before the furnace annealing process will experience limited shrinkage and therefore limited stress. Therefore, densification of the film prior to a furnace anneal step is important to improve the properties of the final film.

In FIG. 6, the refractive index (n) was tested across the film depth for films deposited using bulk fill deposition method and compared to the refractive index across film depth for films deposited pursuant to one implementation of a cyclic sequential deposition and cure method described herein. Throughout film depth, the film deposited by cyclic sequential deposition and curing process displays greater refractive index, less refractive index variation through the formed layer stack and therefore greater density uniformity than the film deposited by a single deposition and curing process. In this case, refractive index was measured for a light wavelength of 250 nm for a single-process bulk fill deposition and curing process and for a cyclic sequential deposition and curing process. For the single cycle deposition and cure method (i.e., labeled "1x" in FIG. 6), the refractive index at the bottom of the film (about 1.9) was much lower than the refractive index at the surface of the film (about 2.2). For the cyclic sequential deposition and cure method with twenty cycles (i.e., labeled "Cyclic" in FIG. 6), the refractive index varied much less across film depth, indicating greater uniformity of density and therefore greater film quality. Furthermore, the refractive index was even higher (above 2.3) at the bottom of the film than at the surface (about 2.1). It is believed that this reverse effect, or differing shape of, the measured refractive index is observed because the deeper layers are cured more times, resulting in increased density at deeper depths compared to the density at the surface.

Figure 7:
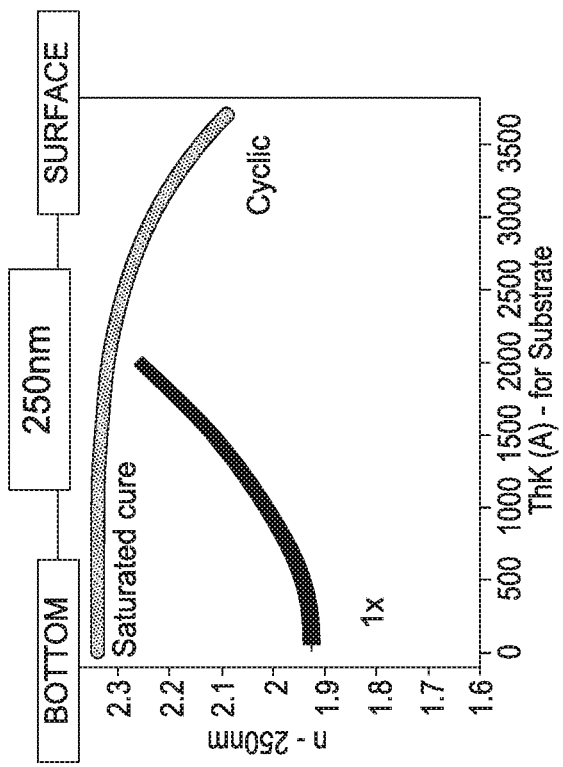
FIG. 7 is a graph comparing the extinction coefficient across a conventional bulk fill deposited and cured film as a function of depth with the extinction coefficient of a film deposited by one implementation of a cyclic sequential deposition and curing methods described herein as a function of depth.

FIG. 7 is a graph comparing the extinction coefficient (k) across a conventional bulk fill deposited and cured film as a function of depth with the extinction coefficient of a film deposited by one implementation of a cyclic sequential deposition and curing methods described herein as a function of depth. The extinction coefficient (k) is an indicator of the degree of cross-linking in a film, such that a higher k value indicates greater cross-linking. In this case, extinction coefficient was measured for a light wavelength of 250 nm for a single-process bulk fill deposition and curing process and for a cyclic sequential deposition and curing process. For the single cycle deposition and cure method (i.e., labeled "1x" in FIG. 7), the extinction coefficient was lower throughout the film, ranging from about 0.2 to less than 0.3. For the cyclic sequential deposition and curing method (i.e., labeled "Cyclic" in FIG. 7), the extinction coefficient was higher throughout the film, ranging from about 0.4 to less than 0.5. Furthermore, the film deposited by the cyclic method demonstrated a higher extinction coefficient at the bottom of the film than at the surface, which is the opposite of the film deposited by a single deposition step process. It is believed that this reverse effect, or differing shape of, the measured extinction coefficient is observed because the deeper layers are cured more times, resulting in increased cross-linking at deeper depths of the cyclically deposited film compared to the degree of cross-linking at the surface.

Figure 8:
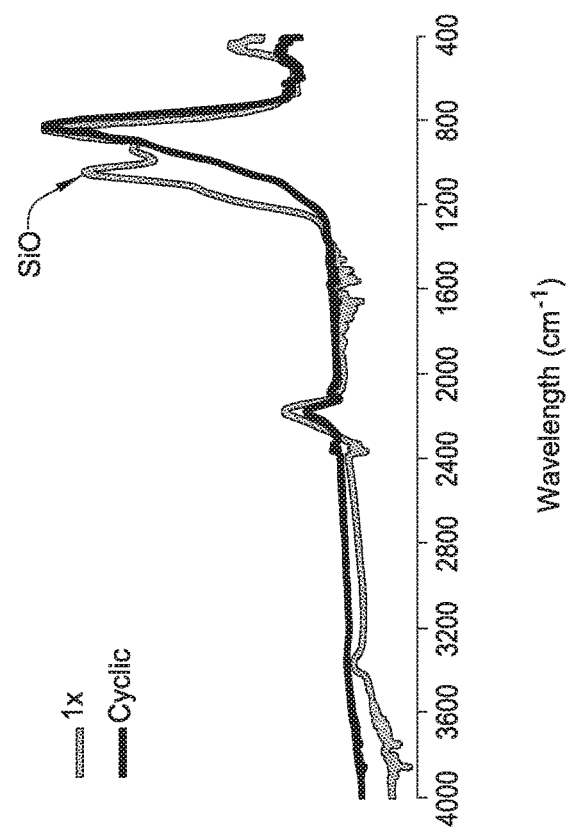
FIG. 8 is a graph comparing film stability after seven days for a film deposited by a conventional bulk fill deposition and curing method with film stability after seven days for a film deposited by one implementation of a cyclic sequential deposition and curing method.

FIG. 8 is a graph comparing film stability for a film deposited by one implementation of a conventional bulk fill deposition and curing method with film stability for a film deposited by one implementation of a cyclic sequential deposition and curing method. Film stability over time is an important indicator of film quality. A higher quality film is less likely to degrade upon exposure to air. In one experiment, illustrated in FIG. 8, Fourier transform infrared (FTIR) spectroscopy was used to measure absorption of light at varying wavelengths. The measurements were taken for a film deposited by conventional bulk-fill deposition method and for a film deposited by cyclic sequential deposition method, both seven days after film deposition. The bulk-fill deposited film has an additional peak at the wavelength correlated with silicon oxide ($SiO_x$), indicating that the bulk-filled film has degraded on exposure to air. By contrast, the cyclically deposited film does not show a peak correlating with the silicon oxide ($SiO_x$) wavelength, indicating that cyclic deposition yields a film that is more stable and less likely to degrade upon exposure to air. This stability allows the deposition of non-oxygen containing flowable films, such as SiN, SiC, SiCN, and polysilicon to create films that do not degrade or "age" with time and air exposure.

Figure 9:
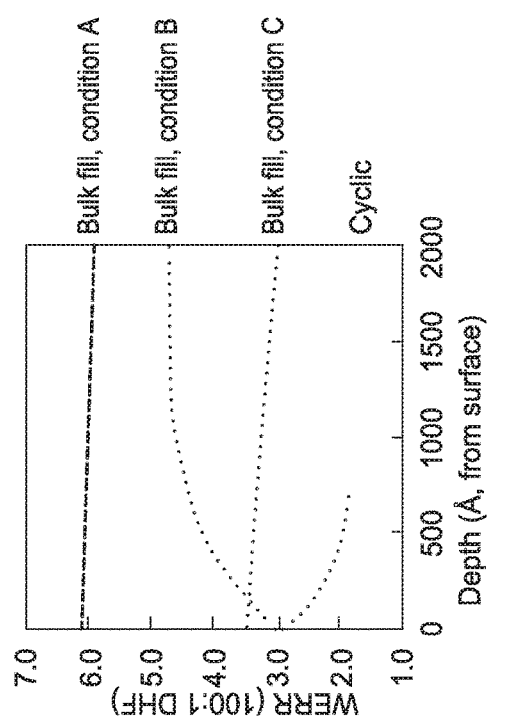
FIG. 9 is a graphical depiction of wet etch rate ratio (WERR) at varying depths from the surface for films deposited by a conventional bulk fill deposition and curing method compared with a film deposited by one implementation of a cyclic sequential deposition and curing method.

FIG. 9 is a graphical depiction of wet etch rate ratio (WERR) at varying depths from the surface for films deposited by one implementation of a conventional bulk fill deposition and curing method compared with a film deposited by one implementation of a cyclic sequential deposition and curing method. A lower WERR indicates increased resistance to dilute hydrofluoric acid (DHF), which indicates a higher quality film. This experiment compared WERR for 100:1 DHF for thin films after thermal densification at 500° C. In FIG. 9, the top three curves show the WERR of three implementations of bulk-fill deposited films over various film depths. The bottom curve shows the WERR for the cyclically deposited film. At one depth, the cyclically deposited film shows a WERR of 1.8, which is dramatically better than the WERR of any of the bulk deposited films (about 3.2, about 4.8, and about 6.0). In another experiment measuring wet etch rate ratio after thermal densification at 750° C., WERR of the cyclically deposited film was even lower compared to bulk fill deposited film.

While the particular apparatus in which the implementations described herein can be practiced is not limited, it is particularly beneficial to practice the implementations in a Producer® Eterna™ FVCD™ system, Producer® Onyx™ system, and Producer® Nanocure™ system sold by Applied Materials, Inc., Santa Clara, Calif. Additionally, FCVD systems available from other manufacturers may also benefit from implementations described herein.

This process may also be used to achieve uniformity in trenches in atomic layer deposition lithography. Although certain implementations herein are discussed in relation to CVD and ALD, it should also be understood that the methods described herein are applicable to all applications in which film thickness and uniformity are critical considerations.

While the foregoing is directed to implementations of the present devices and methods, other and further implementations of the devices and methods may be devised without departing from the basic scope thereof, and the scope thereof is determined by the claims that follow.

The invention claimed is:

1. A method for processing a substrate, comprising:
   forming a first flowable film having a thickness in a feature of a substrate, wherein the thickness is less than the height of the feature, the forming a first flowable film comprising:
      depositing a first thin film layer in the feature; then
      exposing the first thin film layer to an oxygen containing plasma; and then
      exposing the first thin film layer to ultraviolet light, wherein the oxygen containing plasma and the ultraviolet light cure the first thin film layer;
   repeating the forming the first flowable film to form one or more layers of an additional flowable film over the first flowable film, wherein when repeating the forming the first flowable film, each succeeding additional flowable film has a thickness greater than a thickness of a preceding flowable film to prevent excessive curing of each said preceding flowable film, the first flowable film and the one or more layers of the additional flowable film together have a film thickness equal to or greater than the height of the feature; and
   treating the first flowable film and the one or more layers of the additional flowable film causing thermal densification thereof.

2. The method of claim 1, wherein the depositing of the first flowable film comprises:
   providing a silicon containing precursor to a processing region in a substrate processing chamber in which the substrate is disposed;
   providing a gas to a remote plasma system to form a plasma activated gas;
   introducing at least a portion of the plasma activated gas into the processing region; and
   reacting the plasma activated gas and the silicon containing precursor to form the first thin film layer in the feature.

3. The method of claim 1, wherein exposing the first thin film layer to the oxygen containing plasma further comprises exposing the first thin film layer to a nitrogen containing plasma.

4. The method of claim 1, wherein the exposing the first thin film layer to ultraviolet light further comprises positioning the substrate on a pedestal maintained below 100 degrees Celsius, while the substrate is exposed to the ultraviolet light.

5. The method of claim 1, wherein the first flowable film is a non-oxygen containing flowable film.

6. A method for filling a feature in a substrate, comprising:
   forming a first flowable dielectric film having a thickness in the feature, wherein the thickness is less than the height of the feature, wherein the forming of the first flowable dielectric film comprises:

providing a silicon precursor to a processing region in a processing chamber in which the substrate is disposed; then forming a plasma, wherein a gas is exposed to the formed plasma; then introducing at least a portion of the gas that was exposed to the plasma into the substrate processing region; then depositing a thin film layer on the substrate; then exposing the thin film layer to an oxygen containing plasma; and then exposing the thin film layer to ultraviolet light, wherein the oxygen containing plasma and the ultraviolet light cure the thin film layer;

repeating the forming of the first flowable dielectric film to form additional layers of the flowable dielectric film over the first flowable dielectric film, wherein when repeating the forming a first flowable dielectric film, each succeeding formed layer has a thickness greater than a thickness of a preceding formed layer to prevent excessive curing of each said preceding formed layer, the first flowable dielectric film and the additional layers of flowable dielectric film together form a film stack, wherein the thickness of the film stack is equal to or greater than the height of the feature; and treating the film stack causing thermal densification thereof.

7. The method of claim 6, wherein the film stack has a uniform density.

8. A method of forming a layer, the method comprising:
forming a first layer, wherein forming the first layer comprises:
flowing a non-oxygen containing precursor over a patterned substrate disposed in a first substrate processing chamber; then depositing at least a portion of the precursor as a film having a thickness over the patterned substrate, wherein the thickness is less than the depth of a feature on the substrate; then exposing the patterned substrate to a plasma; then transferring the patterned substrate into a second substrate processing chamber equipped with an ultraviolet light source; and then exposing the patterned substrate to ultraviolet light provided by the ultraviolet light source, wherein the plasma and the ultraviolet light cure the film;

repeating the forming the first layer to form additional layers over the first layer, wherein when repeating the forming the first layer, each succeeding formed layer has a thickness greater than a thickness of a preceding formed layer to prevent excessive curing of each said preceding formed layer, the first layer and the additional layers together form a film stack having a uniform density and a film thickness equal to or greater than the height of the feature; and treating the film stack causing thermal densification thereof.

9. The method of claim 8, wherein the method is performed under continuous vacuum.

10. The method of claim 8, wherein the plasma is an oxygen containing plasma.

11. The method of claim 8, wherein the plasma is a nitrogen containing plasma.

12. The method of claim 8, wherein during the exposing the patterned substrate to the ultraviolet light, the patterned substrate is disposed on a pedestal maintained below 100 degrees Celsius.

* * * * *